(12) United States Patent
Inoue et al.

(10) Patent No.: US 12,298,627 B2
(45) Date of Patent: May 13, 2025

(54) LIGHT IRRADIATION DEVICE, AND EXPOSURE APPARATUS PROVIDED THEREWITH

(71) Applicant: PHOENIX ELECTRIC CO., LTD., Himeji (JP)

(72) Inventors: Tomohiko Inoue, Himeji (JP); Kenichi Yamashita, Himeji (JP); Hiromu Matsumoto, Himeji (JP); Tomihiko Ikeda, Himeji (JP)

(73) Assignee: PHOENIX ELECTRIC CO., LTD., Himeji (JP)

( * ) Notice: Subject to any disclaimer, the term of this patent is extended or adjusted under 35 U.S.C. 154(b) by 469 days.

(21) Appl. No.: 17/906,520

(22) PCT Filed: Mar. 17, 2021

(86) PCT No.: PCT/JP2021/010914
§ 371 (c)(1),
(2) Date: Sep. 16, 2022

(87) PCT Pub. No.: WO2021/193301
PCT Pub. Date: Sep. 30, 2021

(65) Prior Publication Data
US 2023/0124785 A1   Apr. 20, 2023

(30) Foreign Application Priority Data

Mar. 24, 2020   (JP) .................................. 2020-053452

(51) Int. Cl.
*G02F 1/13*   (2006.01)
*G02B 5/20*   (2006.01)
(Continued)

(52) U.S. Cl.
CPC .......... *G02F 1/133788* (2013.01); *G02B 5/20* (2013.01); *G02B 5/3058* (2013.01); *G03F 7/2002* (2013.01)

(58) Field of Classification Search
CPC ... G02F 1/133788; G02B 5/20; G02B 5/3058; G03F 7/2002
See application file for complete search history.

(56) References Cited

U.S. PATENT DOCUMENTS

2008/0055521 A1    3/2008   Mizutani et al.
2015/0219919 A1*   8/2015   Ouderkirk ............ G02B 27/285
                                                    359/489.09

FOREIGN PATENT DOCUMENTS

CN    101131436 A    2/2008
CN    107664877 A    2/2018
(Continued)

OTHER PUBLICATIONS

Office Action dated Oct. 20, 2023, for the corresponding Chinese Patent Application No. 202180015510.4, with English translation.
(Continued)

*Primary Examiner* — Nicole M Ippolito
(74) *Attorney, Agent, or Firm* — LUCAS & MERCANTI, LLP

(57) ABSTRACT

A light irradiation device for an exposure apparatus allowing implementation of photo-alignment process with a simple configuration is provided. The light irradiation device is configured using a light source with a plurality of LEDs, and a polarizing element that receives light from the light source and applies the light transmitted through the polarizing element to a workpiece. An optical axis of each of the LEDs is set in such a manner as to have a first angle $\theta 1$ to the workpiece. A second angle $\theta 2$ as an angle half of a light
(Continued)

distribution angle of the light emitted from each of the LEDs is set smaller than the first angle θ1.

5 Claims, 10 Drawing Sheets

(51) Int. Cl.
    *G02B 5/30*     (2006.01)
    *G02F 1/1337*     (2006.01)
    *G03F 7/20*     (2006.01)

(56) References Cited

FOREIGN PATENT DOCUMENTS

| | | |
|---|---|---|
| CN | 209014871 U | 6/2019 |
| JP | 2001512850 A | 8/2001 |
| JP | 2005010408 A | 1/2005 |
| JP | 2006-323060 A | 11/2006 |
| JP | 2007-017475 A | 1/2007 |
| JP | 2016-153920 A | 8/2016 |
| TW | 201636660 A | 10/2016 |

OTHER PUBLICATIONS

International Search Report for the corresponding Patent Application No. PCT/JP2021/010914 dated Jun. 1, 2021, with English translation.

European Patent Office, "Extended European Search Report" dated Mar. 21, 2024 in connection with the related European patent application No. 21776652.6, 8 pages.

Office Action, dated Jun. 25, 2024, issued for the corresponding Taiwanese Patent Application No. 110110478, 8 pages, with English Translation.

Office Action ("Communication") issued on Oct. 10, 2024, issued for the corresponding Korean Patent Application No. 20220129605, 14 pages, with English translation.

Office Action for the corresponding Saudi Arabian Patent Application No. 522440568, dated Feb. 16, 2023, with English translation (12 pages).

Office Action for the corresponding India Patent Application No. 202227052847, dated Feb. 17, 2023.

* cited by examiner

LIGHT IRRADIATION DEVICE, AND EXPOSURE APPARATUS PROVIDED THEREWITH

CROSS REFERENCE TO RELATED APPLICATION

This Application is a 371 of PCT/JP2021/010914 filed on Mar. 17, 2021 which, in turn, claimed the priority of Japanese Patent Application No. 2020-053452 filed on Mar. 24, 2020, both applications are incorporated herein by reference.

BACKGROUND OF THE INVENTION

Technical Field

The present invention relates to a light irradiation device used mainly for exposure during manufacture of liquid crystal panels, and an exposure apparatus provided with the light irradiation device.

Background Art

For use of liquid crystal as a display panel under the TN system, the liquid crystal does not operate normally by merely enclosing the liquid crystal between two glass substrates and applying a voltage to transparent electrodes formed on inner surfaces of these glass substrates. The reason for this is that liquid crystal molecules are in a disordered state.

In order for the liquid crystal to operate normally under the TN system, the liquid crystal molecules are required to be aligned in a certain direction and the liquid crystal molecules are required to rise to a constant direction. More specifically, the liquid crystal molecules are aligned in a direction tilted by about 3° from the glass substrate and this tilt angle is called a pretilt angle.

Of the glass substrates in a pair having the capability to align the liquid crystal, one of the glass substrates is arranged in such a manner as to achieve alignment in an X direction and the other opposite glass substrate is arranged in a Y direction orthogonal to the X direction (TN system).

As described above, liquid crystal alignment process is required in manufacture of liquid crystal panels and rubbing process has conventionally been performed by which a surface of a glass substrate is rubbed physically (see Patent Literature 1, for example). This rubbing process is a processing method of forming a film allowing liquid crystal molecules to be aligned in a constant direction by rubbing an organic polymer film formed on the glass substrate with a long-pile cloth in a predetermined direction, for example.

The popularization of the rubbing process and use of the TN system providing high response speed as a common system form a background for mass production of liquid crystal panels with stable performances at low cost, thereby making liquid crystal monitors widely available as display monitors of OA equipment such as personal computers and as display monitors of game machines.

However, the rubbing method has problems relating to reliability in terms of poor uniformity, the presence of possibility of damage of a TFT by electrostatic discharge, and adhesion of powder waste occurring during the rubbing.

Additionally, according to the TN system as a representative of a horizontal alignment liquid crystal mode described above, the pretilt angle attainable by the rubbing method is about 3°. This imposes difficulty in constructing a display panel in a liquid crystal mode responsive to high-speed response under low-voltage driving.

In response to the above-described problems of the rubbing method, an exposure machine allowing implementation of photo-alignment process is currently suggested. In this exposure machine, attempt is made to use a long-arc mercury lamp as a light source.

SUMMARY OF THE INVENTION

Patent Literature 1: Japanese Patent Application Publication No. 2007-17475

SUMMARY OF INVENTION

However, the exposure machine using the long-arc mercury lamp is still considered to have a problem. An exposure material has photosensitive characteristics that are generally set in such a manner as to respond to light of a particular wavelength region. Meanwhile, examining spectral characteristics of light from the mercury lamp makes it clear that the light of the particular wavelength region is composed of many bright lines of mercurial lines.

For this reason, using the mercury lamp as a light source for exposure increases light having wavelengths deviating from the photosensitive characteristics of the exposure material. This is considered to cause the risk of excessive exposure of the exposure material to such light of the wavelengths deviating from the photosensitive wavelength region.

Light beams of wavelengths (shorter wavelength and longer wavelength) deviating from the photosensitive characteristics can certainly be cut using a selective wavelength reflection film. However, this requires a narrow-band cut filter (band-pass filter) and requires a high degree of accuracy, resulting in cost increase of the machine.

Light emitted from the long-arc mercury lamp diffuses widely, making it difficult to control an irradiation angle of light from the mercury lamp significant for performing photo-alignment process. In response to this, employing a method of blocking unnecessary light with a louver is examined, for example. However, this causes a different problem that efficiency of use of light emitted from the mercury lamp is reduced.

As another method, collimated (parallelized) light may diagonally be emitted to a glass substrate. However, this method is considered to cause a problem in terms of size increase and cost increase of a device as it involves a complicated optical system.

The present invention has been made in view of the above-described problems, and is intended to provide a light irradiation device for an exposure apparatus allowing implementation of photo-alignment process with a simple configuration.

A light irradiation device provided by one aspect of the present invention comprises:
- a light source with a plurality of LEDs; and
- a polarizing element that receives light from the light source and applies the light transmitted through the polarizing element to a workpiece, wherein
- an optical axis of each of the LEDs has a first angle to the workpiece, and
- a second angle as an angle half of a light distribution angle of the light emitted from each of the LEDs is smaller than the first angle.

Preferably, the light irradiation device further comprises:
a light-transmitting plate provided between the light source and the polarizing element and arranged parallel to the workpiece.

A light irradiation device provided by another aspect of the present invention comprises:
a light source with a plurality of LEDs;
a polarizing element that receives light from the light source and applies the light transmitted through the polarizing element to a workpiece; and
an optical filter that transmits light selectively that is part of the light emitted from the light source and has a wavelength of equal to or greater than a predetermined wavelength, wherein
the optical filter is configured in such a manner that, with increase in an incidence angle of the light to the optical filter having the wavelength of equal to or greater than the predetermined wavelength, the transmittance of the light having the wavelength of equal to or greater than the predetermined wavelength is increased.

A light irradiation device provided by still another aspect of the present invention comprises:
a light source with a plurality of LEDs;
a polarizing element that receives light from the light source and applies the light transmitted through the polarizing element to a workpiece; and
a cover member that transmits the light from the light source, wherein
the polarizing element has a forming surface for a wire grid,
the cover member is located at a position facing the forming surface of the polarizing element, and
a space between the cover member and the forming surface is enclosed.

According to another aspect of the present invention, an exposure apparatus comprising the light irradiation device described above is provided.

In the light irradiation device according to the present invention, the optical axis of each of the LEDs is tilted by the first angle from the workpiece, and the second angle corresponding to half of the light distribution angle of the light emitted from each of the LEDs is set smaller than the first angle. By doing so, the light emitted from each of the LEDs is entirely caused to travel closer to the optical axis of the LED than a normal from the LED toward the workpiece.

By doing so, it becomes possible to provide a light irradiation device for an exposure apparatus allowing photo-alignment process handling a large quantity of light having an effective irradiation angle to be performed with the simple configuration.

DETAILED DESCRIPTION OF EMBODIMENTS (Configuration of Light Irradiation Device 10 According to First Embodiment)

Figure 1:
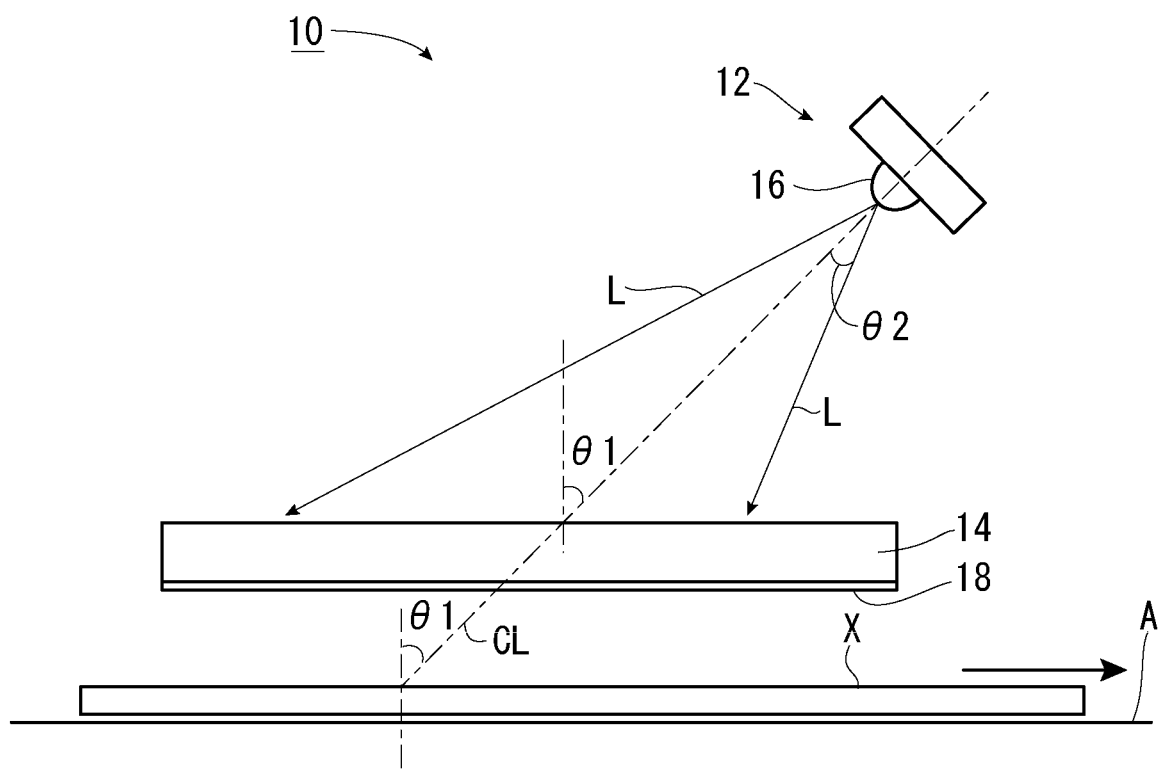
FIG. 1 shows a light irradiation device 10 according to a first embodiment to which the present invention is applied.

The following describes a light irradiation device 10 according to a first embodiment to which the present invention is applied. The light irradiation device 10 is incorporated in an exposure apparatus and used mainly for exposure during manufacture of liquid crystal panels. As shown in FIG. 1, in outline, the light irradiation device 10 includes a light source 12 and a polarizing element 14.

The light source 12 is a member that emits light L for exposure toward an exposure surface A on which a workpiece (exposure target) X is placed, and is configured using a plurality of LEDs 16 in the first embodiment. The LEDs 16 emit the light L for exposure in such a manner as to scan the workpiece X moving in a certain direction on the exposure surface A. To achieve this, the light source 12 is formed by arranging the LEDs 16 substantially serially in a direction orthogonal to the direction of movement of the workpiece X.

Each LED 16 forming the light source 12 is arranged at a tilt from the workpiece X (namely, from the exposure surface A) in such a manner that an optical axis CL of this LED 16 has a first angle $\theta 1$ (specifically, incidence angle $\theta 1$) to the workpiece X. By using an alignment film formed by diagonally emitting light with little fluctuation in angular component in a liquid crystal panel, it becomes possible to provide a stable pretilt angle and a stable alignment state. Thus, a liquid crystal panel in an arbitrary alignment mode can be attained.

Furthermore, a second angle $\theta 2$ as an angle half of a light distribution angle of the light L emitted from each LED 16 is set smaller than the first angle $\theta 1$ described above.

The polarizing element 14 is an element that transmits and polarizes only a light component that is part of the light emitted from the light source 12 and vibrates in one direction. In the first embodiment, a wire grid polarizing element is used. The wire grid polarizing element is prepared by forming a wire grid on one surface of a transparent substrate (glass substrate). In the first embodiment, a forming surface 18 for the wire grid may be a surface of the polarizing element 14 closer to the light source 12 or may be a surface thereof on the opposite side of the light source 12. Preferably, the polarizing element 14 is arranged parallel to the workpiece X (exposure surface A).

(Effect of Light Irradiation Device 10 According to First Embodiment)

In the light irradiation device 10 according to the first embodiment, the optical axis CL of each of the LEDs 16 is tilted by the first angle $\theta 1$ from the workpiece X, and the second angle $\theta 2$ corresponding to half of the light distribution angle of the light L emitted from each LED 16 is set smaller than the first angle $\theta 1$. By doing so, the light L emitted from each LED 16 is entirely caused to travel closer to the optical axis CL of the LED 16 than a normal from the LED 16 toward the workpiece X.

By doing so, it becomes possible to provide the light irradiation device 10 for an exposure apparatus allowing photo-alignment process handling a large quantity of light having an effective irradiation angle to be performed with the simple configuration.

(Configuration of Light Irradiation Device 10 According to Second Embodiment)

Figure 2:
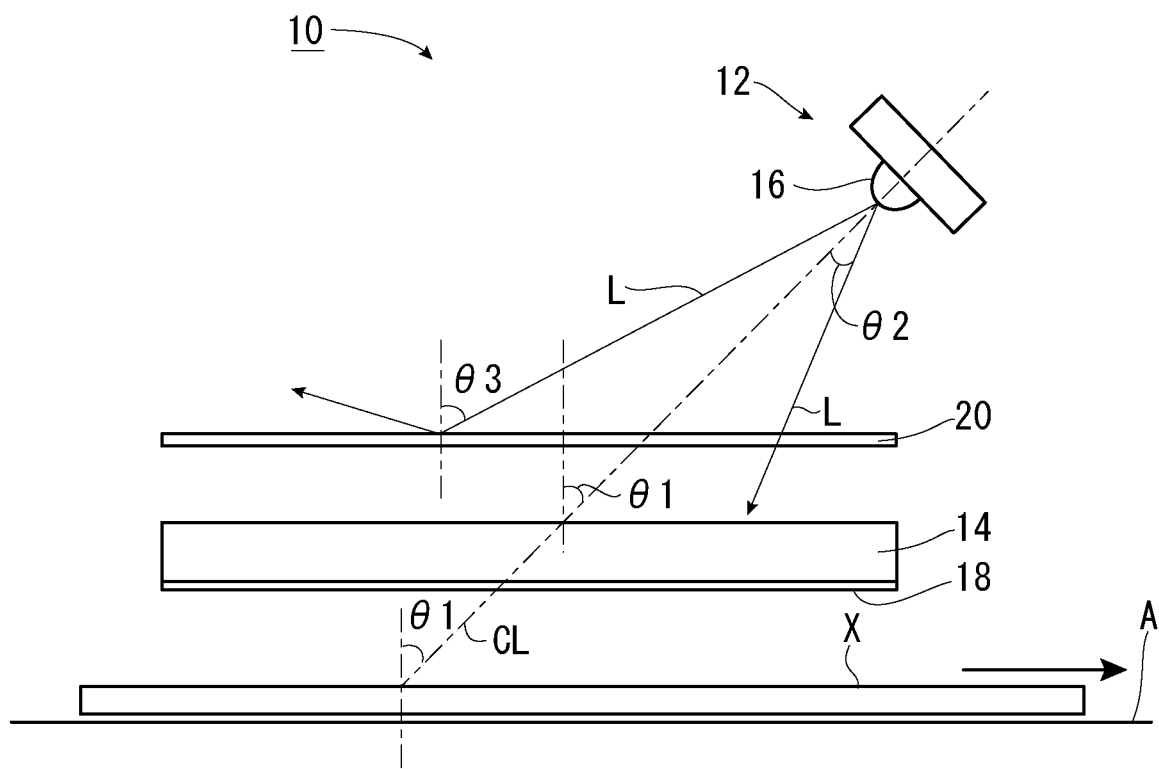
FIG. 2 shows a light irradiation device 10 according to a second embodiment to which the present invention is applied.

As shown in FIG. 2, a light irradiation device 10 according to a second embodiment includes a light-transmitting plate 20 added to the light irradiation device 10 according to the first embodiment described above.

The light-transmitting plate 20 is a plate member made of glass, for example, and transmits the light L from the light source 12. The light-transmitting plate 20 is arranged between the light source 12 and the polarizing element 14 and parallel to the workpiece X. Preferably, implementation of antireflection process such as provision of an antireflection film is avoided on a surface of the light-transmitting plate 20 (including both surfaces thereof).

(Effect of Light Irradiation Device 10 According to Second Embodiment)

In the light irradiation device 10 according to the second embodiment, the light L that is part of the light L emitted from the light source 12 and enters the light-transmitting plate 20 at a large incidence angle θ3 does not reach the polarizing element 14 or the workpiece X as it is reflected on a surface of the light-transmitting plate 20.

By doing so, regarding the light L to reach the workpiece X, it becomes possible to limit an incidence angle of this light L to the workpiece X to be equal to or less than a predetermined value. This makes it possible to perform photo-alignment process with a more stable pretilt angle.

(Configuration of Light Irradiation Device 10 According to Third Embodiment)

Figure 3:
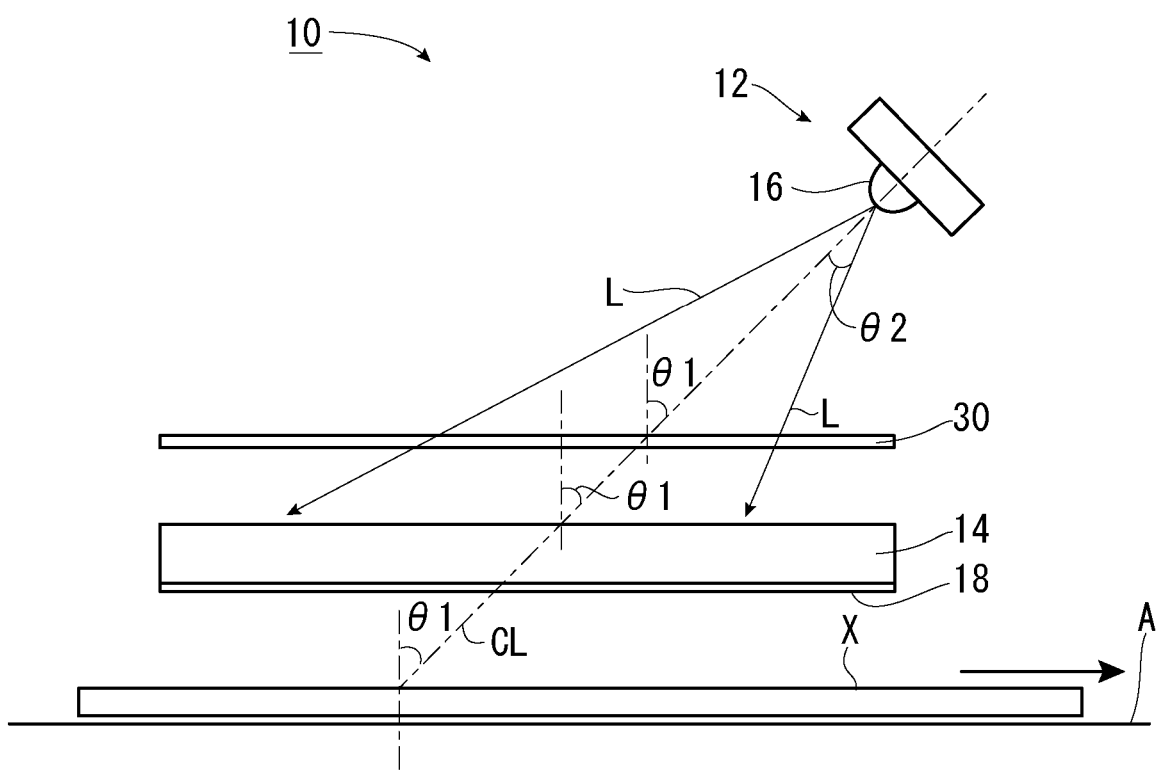
FIG. 3 shows a light irradiation device 10 according to a third embodiment to which the present invention is applied.

As shown in FIG. 3, in outline, a light irradiation device 10 according to a third embodiment includes a light source 12, a polarizing element 14, and an optical filter 30.

Like in the first and second embodiments, the light source 12 is a member that emits light L for exposure toward an exposure surface A on which a workpiece X is placed, and is configured using a plurality of LEDs 16. The LEDs 16 emit the light L for exposure in such a manner as to scan the workpiece X moving in a certain direction on the exposure surface A. To achieve this, the light source 12 is formed by arranging the LEDs 16 substantially serially in a direction orthogonal to the direction of movement of the workpiece X.

Unlike in the first and second embodiments, in the light irradiation device 10 according to the third embodiment, the first angle θ1 and the second angle θ2 are not required to be defined but the first angle θ1 and the second angle θ2 may be determined freely. Like in the first and second embodiments, the first angle θ1 and the second angle θ2 may certainly be defined.

The polarizing element 14 is an element that transmits and polarizes only a light component that is part of light emitted from the light source 12 and vibrates in one direction. Like in the first and second embodiments, a wire grid polarizing element is used.

A forming surface 18 for a wire grid may be a surface of the polarizing element 14 closer to the light source 12 or may be a surface thereof on the opposite side of the light source 12. Preferably, the polarizing element 14 is arranged parallel to the workpiece X (exposure surface A).

The optical filter 30 is a member provided between the light source 12 and the polarizing element 14, and transmits the light L selectively that is part of the light L emitted from the light source 12 and has a wavelength of equal to or greater than a predetermined wavelength. The optical filter 30 has a surface provided with a wavelength selection film.

Like the polarizing element 14, the optical filter 30 is preferably arranged parallel to the workpiece X (exposure surface A). As long as conditions given below are fulfilled, a filter to be used as the optical filter 30 may be a long-pass filter that transmits light having a wavelength of equal to or greater than a predetermined wavelength or a band-pass filter that transmits light within a predetermined wavelength range and blocks light of a longer wavelength and light of a shorter wavelength. The optical filter 30 may be arranged on the opposite side of the light source 12 relative to the polarizing element 14.

Figure 4:
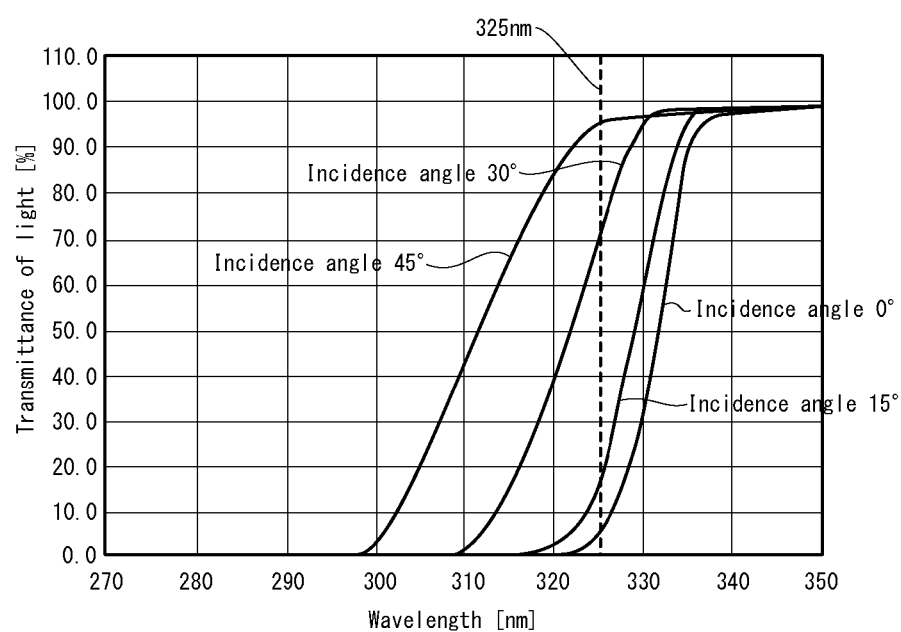
FIG. 4 is a graph for explaining light-transmitting characteristics of an optical filter 30.

The optical filter 30 has angular dependency. As the incidence angle θ1 of light entering the optical filter 30 becomes larger, the wavelength region of light to be transmitted through the optical filter 30 extends toward a lower wavelength. FIG. 4 shows an example of this dependency. With a focus on light of 325 nm, for example, if the incidence angle θ1 of the light to the optical filter 30 is 0° (specifically, if the light enters the optical filter 30 vertically), the transmittance of the light of 325 nm is about 5%.

As the incidence angle of the light of 325 nm to the optical filter 30 is increased to 15°, 30°, and 45°, the transmittance of the light of 325 nm is increased to 15%, 70%, and 95%.

By taking advantage of this behavior of the optical filter 30, the optical filter 30 is configured in such a manner that, with increase in the incidence angle θ1 of the light L to the optical filter 30 having a wavelength of equal to or greater than a predetermined wavelength, the transmittance of the light L having the wavelength of equal to or greater than the predetermined wavelength is increased. By doing so, it becomes possible to transmit the light L sufficiently having a wavelength of equal to or greater than an intended wavelength at an incidence angle (first angle θ1) to the optical filter 30 responsive to an intended pretilt angle.

(Effect of Light Irradiation Device 10 According to Third Embodiment)

In the light irradiation device 10 according to the third embodiment, it is difficult for the light L that is part of the light L emitted from the light source 12 and enters the optical filter 30 at the small incidence angle θ1 (the light entering the optical filter 30 substantially vertically) to be transmitted through the optical filter 30. Thus, exposure can be performed mainly using the light L of an incidence angle close to the intended incidence angle θ1 to the workpiece X, making it possible to attain a more stable pretilt angle.

(Configuration of Light Irradiation Device 10 According to Fourth Embodiment)

Figure 5:
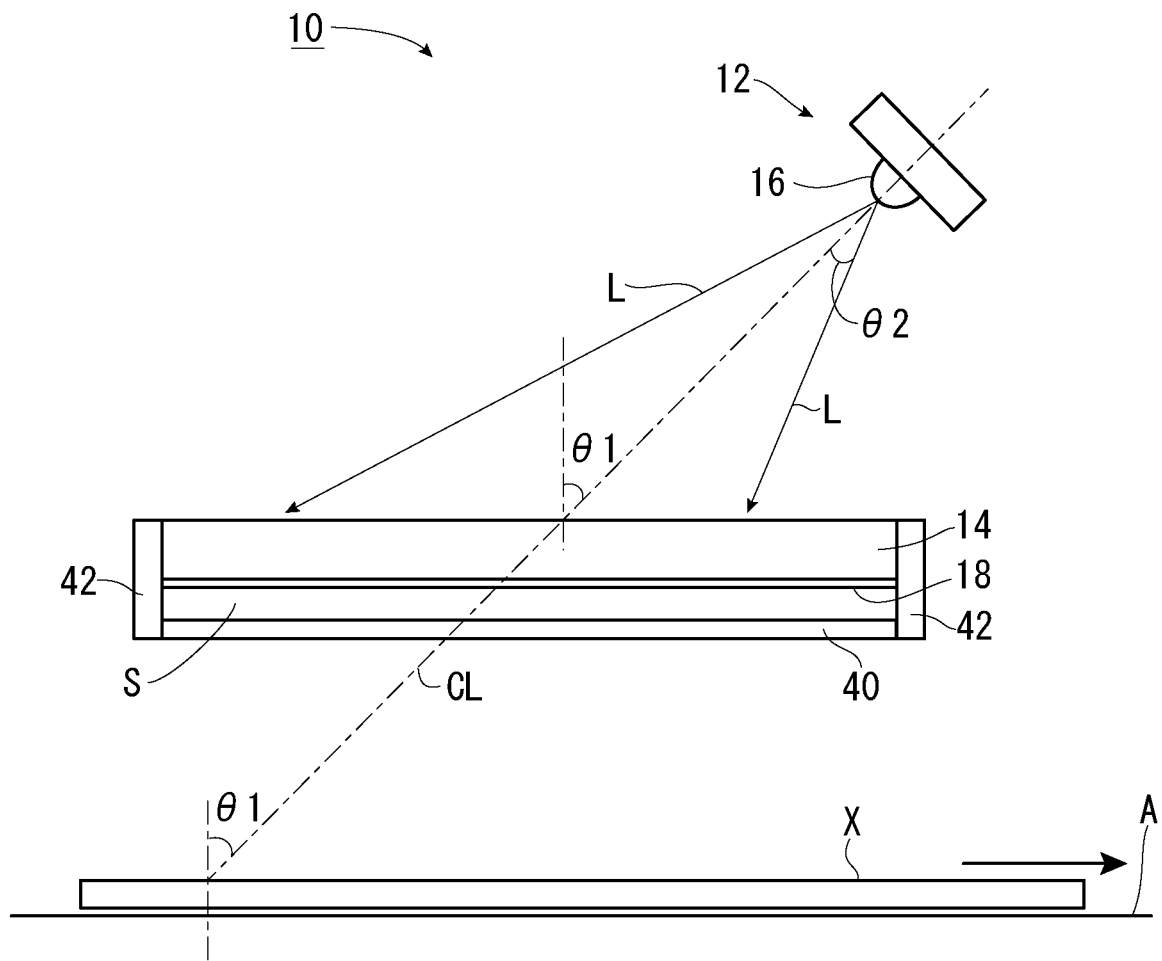
FIG. 5 shows a light irradiation device 10 according to a fourth embodiment to which the present invention is applied.

As shown in FIG. 5, in outline, a light irradiation device 10 according to a fourth embodiment includes a light source 12, a polarizing element 14, and a cover member 40.

Like in the above-described embodiments, the light source 12 is a member that emits light L for exposure toward an exposure surface A on which a workpiece X is placed, and is configured using a plurality of LEDs 16. The LEDs 16 emit the light L for exposure in such a manner as to scan the workpiece X moving in a certain direction on the exposure surface A. To achieve this, the light source 12 is formed by arranging the LEDs 16 substantially serially in a direction orthogonal to the direction of movement of the workpiece X.

Unlike in the first and second embodiments, in the light irradiation device 10 according to the fourth embodiment, the first angle θ1 and the second angle θ2 are not required to be defined but the first angle θ1 and the second angle θ2 may be determined freely. Like in the first and second embodiments, the first angle θ1 and the second angle θ2 may certainly be defined.

The polarizing element 14 is an element that transmits and polarizes only a light component that is part of light emitted from the light source 12 and vibrates in one direction. Like in the first and second embodiments, a wire grid polarizing element is used.

A forming surface 18 for a wire grid may be a surface of the polarizing element 14 closer to the light source 12 or may be a surface thereof on the opposite side of the light source 12. Preferably, the polarizing element 14 is arranged parallel to the workpiece X (exposure surface A).

The cover member 40 is a plate member made of glass, for example, and transmits the light L from the light source 12. The cover member 40 is located at a position facing the forming surface 18 for the wire grid of the polarizing element 14 and is arranged substantially parallel to the workpiece X. Specifically, if the forming surface 18 for the wire grid of the polarizing element 14 is formed on the opposite side of the light source 12 as shown in the drawing, the cover member 40 is also formed on the opposite side of the light source 12 relative to the polarizing element 14. Conversely, if the forming surface 18 for the wire grid of the polarizing element 14 is formed closer to the light source 12 (not shown in the drawings), the cover member 40 is also arranged closer to the light source 12 relative to the polarizing element 14.

While implementation of antireflection process such as provision of an antireflection film may be avoided on a surface of the cover member 40 (including both surfaces thereof), one or both of these surfaces are preferably subjected to antireflection process such as provision of antireflection films.

Preferably, a space S between the cover member 40 and the forming surface 18 for the wire grid of the polarizing element 14 is enclosed. This may be achieved, for example, by providing a holding frame 42 holding a periphery of the cover member 40 and a periphery of the polarizing element 14 and enclosing the space S between the cover member 40 and the forming surface 18 for the wire grid of the polarizing element 14 using the holding frame 42.

The "enclosure" described above means a level at which entry of a tiny solid matter such as a siloxane compound into the space S is prohibited. "Enclosure" in a perfect sense is not required.

Preferably, the polarizing element 14 is configured using a so-called "reflective-type" wire grid. The reason for this is that the "reflective type" reduces the probability of occurrence of damage on the forming surface 18 for the wire grid, etc., to be caused by heating of the wire grid with the light L from the light source 12 and unintentional increase in temperature in the enclosed space.

Furthermore, for the purpose of cooling the enclosed space S, a member forming the space S such as the cover member 40, the polarizing element 14, or the holding frame 42 may be cooled by a method such as forced-air cooling or water-cooling.

(Effect of Light Irradiation Device 10 According to Fourth Embodiment)

In the light irradiation device 10 according to the fourth embodiment, the cover member 40 is arranged at a position facing the forming surface 18 for the wire grid of the polarizing element 14. This makes it possible to prevent damage on the forming surface 18 for the wire grid erroneously during maintenance of the light irradiation device 10, for example, and makes it possible to prevent adhesion of dirt caused by a tiny solid matter such as a siloxane compound to the forming surface 18 for the wire grid.

(First Modification)

Figure 6:
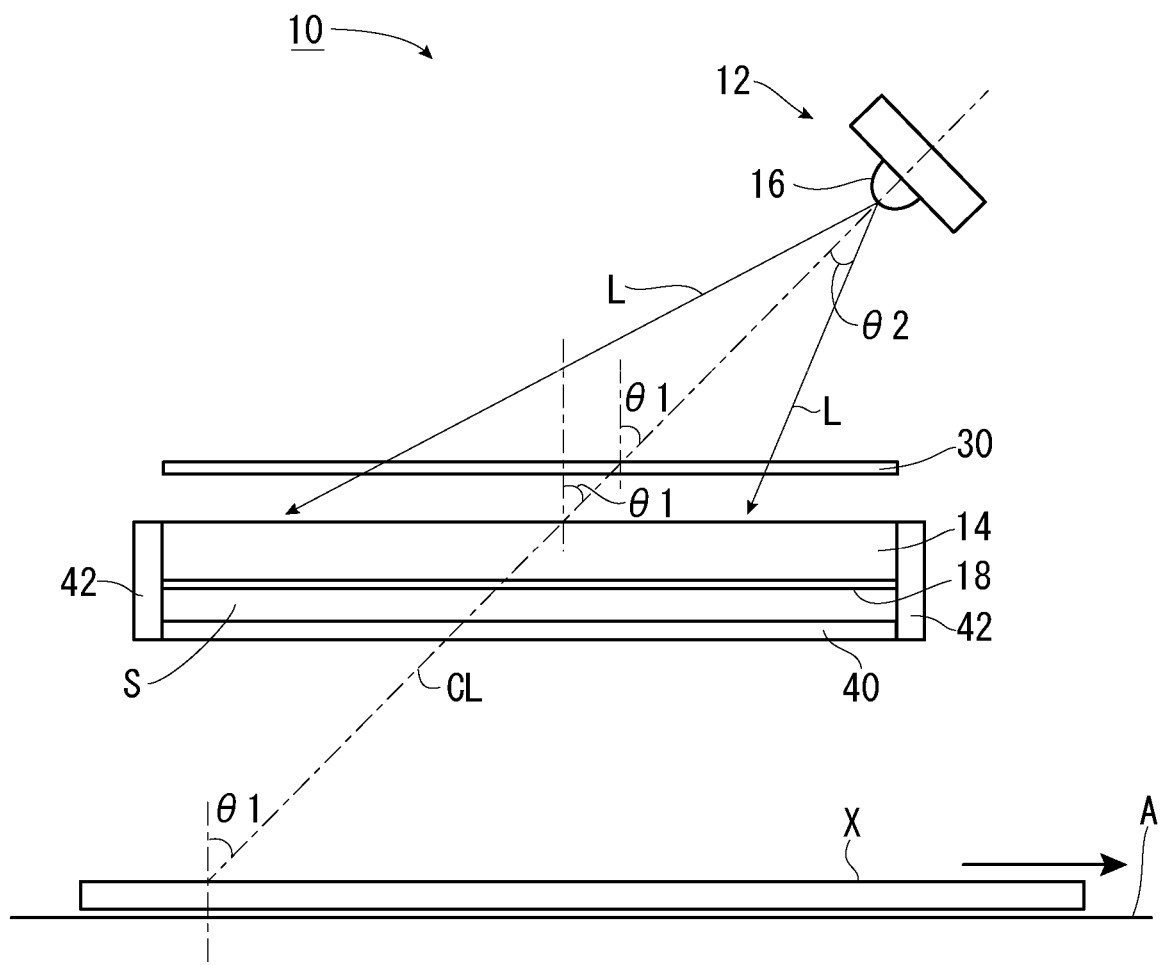
FIG. 6 shows a light irradiation device 10 according to a first modification.

The configurations of the light irradiation device 10 according to the first to fourth embodiments described above can be combined with each other. As shown in FIG. 6, by combining the optical filter 30 of the third embodiment and the cover member 40 of the fourth embodiment, for example, it becomes possible to form a light irradiation device 10 in which the optical filter 30, the polarizing element 14, and the cover member 40 are arranged in this order in order of decreasing proximity from the light source 12.

The positions of the polarizing element 14 and the cover member 40 can certainly be reversed to form a light irradiation device 10 in which the optical filter 30, the cover member 40, and the polarizing element 14 are arranged in this order in order of decreasing proximity from the light source 12.

Figure 7:
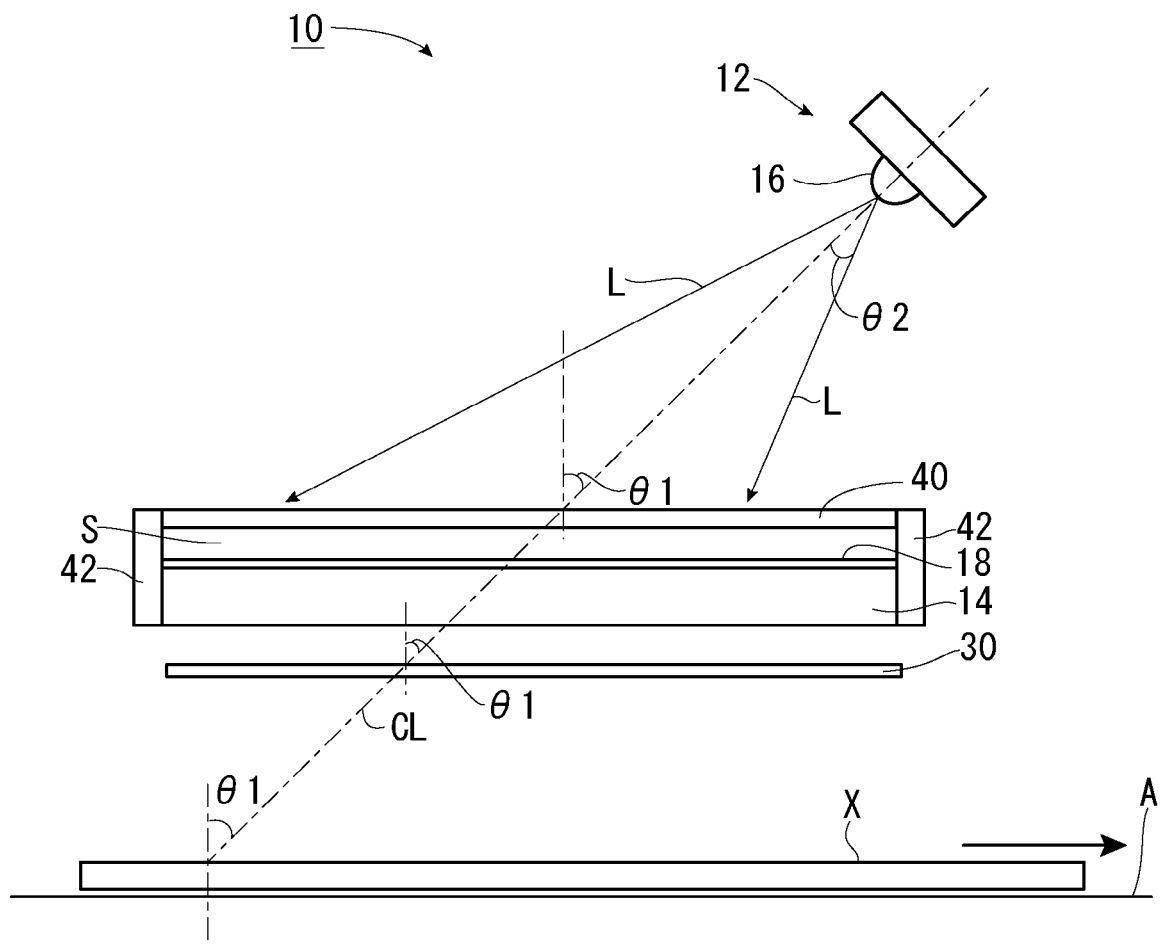
FIG. 7 shows a light irradiation device 10 according to the first modification.

Additionally, as shown in FIG. 7, the optical filter 30 may be arranged at a position closest to the workpiece to form a light irradiation device 10 in which the cover member 40, the polarizing element 14, and the optical filter 30 are arranged in this order in order of decreasing proximity from the light source 12.

(Second Modification)

Figure 8:
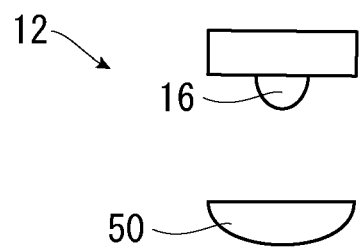
FIG. 8 shows a light source 12 according to a second modification.

As shown in FIG. 8, a lens 50 for controlling a light distribution angle of the light L from the LED 16 may further be provided for the light source 12 used in the light irradiation device 10 according to each of the first to fourth embodiments described above. The number of the lenses 50 may be one as shown in the drawing, or two or more.

Figure 9:
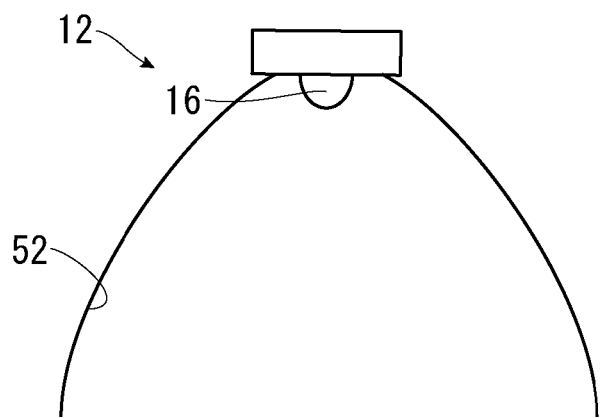
FIG. 9 shows a light source 12 according to the second modification.

As shown in FIG. 9, a reflector 52 for controlling a light distribution angle of the light L from the LED 16 may further be provided for the light source 12 used in the light irradiation device 10 according to each of the first to fourth embodiments described above.

Figure 10:
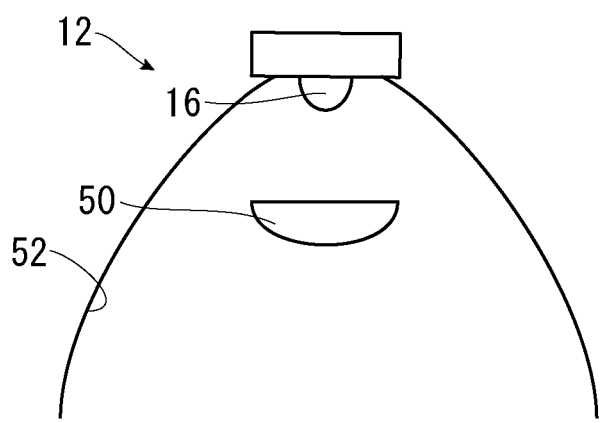
FIG. 10 shows a light source 12 according to the second modification.

As shown in FIG. 10, the lens 50 and the reflector 52 may be used in combination for controlling a light distribution angle of the light L from the LED 16.

It should be considered that the embodiments disclosed herein are in all aspects illustrative and not restrictive. The scope of the present invention is shown not by the above-described embodiments but by the claims, and is intended to include all modifications within a meaning and a scope equivalent to the scope of the claims.

REFERENCE NUMBER LIST

10 . . . Light irradiation device, 12 . . . Light source, 14 . . . Polarizing element, 16 . . . LED, 18 . . . Forming surface for wire grid
20 . . . Light-transmitting plate
30 . . . Optical filter
40 . . . Cover member, 42 . . . Holding frame
50 . . . Lens, 52 . . . Reflector
X . . . Workpiece (exposure target), A . . . Exposure surface, L . . . Light for exposure, CL . . . Optical axis (of LED 16), $\theta 1$ . . . First angle, $\theta 2$ . . . Second angle, $\theta 3$ . . . Incidence angle (to light-transmitting plate 20), S . . . Space (between cover member 40 and forming surface 18 for wire grid)

The invention claimed is:

1. A light irradiation device comprising:
a light source with a plurality of LEDS;
a polarizing element that receives light from the light source and applies the light transmitted through the polarizing element to a workpiece; and an optical filter that transmits light selectively that is part of the light emitted from the light source and has a wavelength of equal to or greater than a predetermined wavelength, wherein the optical filter is configured in such a manner that, with increase in an incidence angle of the light to the optical filter having the wavelength of equal to or greater than the predetermined wavelength, the transmittance of the light having the wavelength of equal to or greater than the predetermined wavelength is increased.

2. The light irradiation device according to claim 1, wherein an optical axis of each of the LEDs has a first angle to the workpiece, and a second angle as a half angle of a light distribution angle of the light emitted from each of the LEDs is smaller than the first angle.

3. The light irradiation device according to claim 2, further comprising:

a light-transmitting plate provided between the light source and the polarizing element and arranged parallel to the workpiece.

4. The light irradiation device according to claim 1, further comprising:

a cover member that transmits the light from the light source, wherein the polarizing element has a forming surface for a wire grid, the cover member is located at a position facing the forming surface of the polarizing element, and a space between the cover member and the forming surface is enclosed.

5. An exposure apparatus comprising the light irradiation device according to claim 1.

* * * * *